(12) United States Patent
Sakui et al.

(10) Patent No.: US 6,239,495 B1
(45) Date of Patent: *May 29, 2001

(54) MULTICHIP SEMICONDUCTOR DEVICE AND MEMORY CARD

(75) Inventors: Koji Sakui, Tokyo; Junichi Miyamoto, Yokohama; Nobuo Hayasaka, Yokosuka; Katsuya Okumura, Yokohama, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/363,031

(22) Filed: Jul. 29, 1999

(30) Foreign Application Priority Data

Jul. 29, 1998 (JP) ................................... 10-213880

(51) Int. Cl.⁷ ..................... H01L 23/48; H01L 23/52; H01L 29/40
(52) U.S. Cl. .................... 257/777; 257/723; 257/737; 257/685; 257/686
(58) Field of Search .................. 257/723, 737, 257/777, 685, 686; 438/613; 228/180.22

(56) References Cited

U.S. PATENT DOCUMENTS

| | | | |
|---|---|---|---|
| 4,803,450 | * | 2/1989 | Burgess et al. .............. 228/180.22 |
| 5,089,880 | * | 2/1992 | Meyer et al. .................. 257/777 |
| 5,177,594 | * | 1/1993 | Chance et al. ................ 257/678 |
| 5,579,207 | * | 11/1996 | Hayden et al. ................ 361/790 |
| 5,995,379 | * | 11/1999 | Kyougoku et al ............ 361/803 |
| 6,087,719 | * | 7/2000 | Tsunashima .................. 257/686 |

FOREIGN PATENT DOCUMENTS 10-223833   8/1998  (JP) .

* cited by examiner

*Primary Examiner*—Eddie C. Lee
*Assistant Examiner*—Jhihan B Clark
(74) *Attorney, Agent, or Firm*—Banner & Witcoff, Ltd.

(57) ABSTRACT

A multichip semiconductor device comprises a plurality of semiconductor chips, each including elements integrated in a semiconductor substrate. The semiconductor chips have substantially the same structure. Each semiconductor chip includes a connecting plug inserted in a through hole made through the semiconductor substrate. The semiconductor chips are stacked in layers. The connecting plugs of the semiconductor chips are selectively connected through metal bumps. Allocation of addresses of the semiconductor chips is designated by a connecting pattern of the bumps.

16 Claims, 6 Drawing Sheets

MULTICHIP SEMICONDUCTOR DEVICE AND MEMORY CARD

BACKGROUND OF THE INVENTION

The present invention relates to a multichip semiconductor device and a memory card, and more specifically, a multichip semiconductor device and a memory card on which a plurality of semiconductor memory chips or a plurality of semiconductor chips formed in both semiconductor memories and logic circuits are mounted in layers.

There has been a rapidly increasing demand for memory cards used as film media of digital cameras or storage devices of mobile personal computers. For example, an SSFDC (Solid-State Floppy Disk Card) mounted on a nonvolatile memory, e.g., a NAND-type EEPROM, is known as a kind of memory card, so-called "Smart Media". A memory card on the market at present contains a 16-Mbit or 32-Mbit NAND-type EEPROM and has a memory capacity of 2 Mbytes or 4 Mbytes. However, due to the recent multimedia boom, it is expected that the demand for memory cards with a larger capacity will be much increased. For example, as regards a current digital camera, images corresponding to 30 pictures of 300,000 pixels can be recorded on a card of 2 Mbytes. However, to record 30 pictures with a camera capable of processing an image of 1.3 million pixels, a memory capacity of 8 Mbytes is required. Further, the use of the memory card is to record not only static images but also dynamic images or audio signals. In the case of recording a dynamic image or an audio signal, a much larger memory capacity is required. Therefore, it is desirable that a plurality of semiconductor chips be mounted on a card to realize a large capacity.

However, according to the conventional art, to mount a plurality of semiconductor chips on a card, the card must inevitably be large. More specifically, if chips are arranged on the same plane, the area of the card must be increased. On the other hand, if chips are arranged on a plurality of layers to keep the area of the card small, the card must be thick.

To overcome this problem, the present applicant proposed an invention titled "Multichip Semiconductor Device and Chip for Use in Multichip Semiconductor Device, and Method for Manufacturing the Same" in Japanese Patent Application No. 8-321531 filed Dec. 2, 1996. According to this prior invention, a plurality of semiconductor chips are mounted on a card, the size of which is suppressed to the minimum. The application discloses a multichip semiconductor device comprising a plurality of chips each having a semiconductor substrate on which elements are integrated. The multichip semiconductor device is characterized in that at least one of the chips has a connecting plug inserted in a through hole made through the semiconductor substrate, and that said at least one chip having the plug is electrically connected to another chip.

The technique of the aforementioned multichip semiconductor device can provide a thin memory card which is small in area of the plane surface and simple in structure. However, some problems to be solved are left to realize a smaller memory card or memory device of a larger memory capacity. For example, it is assumed that four 64-Mbit semiconductor chips are used to constitute a 256-Mbit memory device. In this case, if the chips are mounted on a conventional plane board, chip enable bar signals ($\overline{CE}$), i.e., chip control signals for the four chips, may be individually supplied to the chips. However, if such a memory device is realized by the multichip semiconductor structure having chips laminated in layers, instead of the plane board, it is necessary to separate the four interconnection lines for the signals $\overline{CE}$ from one another. This means that four kinds of chips A to D, to which signals $\overline{CE}$ are input at different positions, are required. Four kinds of chips can be produced by four masks for patterning, for example, the uppermost wiring layers of the respective chips. The four kinds of chips may be stacked in a predetermined order, for example, A-B-C-D. However, in consideration of the production cost, this method is not preferable. More specifically, in this case, four kinds of chips must be produced, the produced chips must be tested, and they must be stacked in the predetermined order without fail. Therefore, the memory device comprising the four types of chips is inevitably more expensive than that in which four chips of the same kind are stacked.

As described above, the multichip semiconductor device or the memory card of the conventional art has a problem that it must be large in the case where a plurality of semiconductor chips are mounted.

The applicant of the present invention proposed one means for solving the problem in the aforementioned prior Japanese patent application. However, to realize a smaller memory card or memory device with a much greater memory capacity, a higher manufacturing cost is required.

BRIEF SUMMARY OF THE INVENTION

Accordingly, a first object of the present invention is to provide a thin multichip semiconductor device which is small in area of the plane surface and simple in structure without increasing the manufacturing cost.

A second object of the present invention is to provide a thin memory card which is small in area of the plane surface and simple in structure without increasing the manufacturing cost.

The first object of the present invention is achieved by a multichip semiconductor device comprising a plurality of semiconductor chips of substantially same structure stacked in layers, each semiconductor chip including: a semiconductor substrate and elements integrated therein; an option circuit formed in the semiconductor substrate; a connecting plug inserted in a through hole made through the semiconductor substrate; and a bump for selectively connecting the connecting plug in the semiconductor substrate, wherein the option circuits formed in the semiconductor chips are selected in accordance with a connecting pattern of the bumps.

With the above constitution, since a plurality of semiconductor chips of the same structure are stacked, it is unnecessary to produce a plurality of kinds of semiconductor chips of different structures, and all semiconductor chips can be subjected to the same test. Further, it is unnecessary to consider the order of semiconductor chips to be stacked. Therefore, the production cost can be reduced. In addition, the option circuits in the semiconductor chips can be suitably selected in accordance with the connecting pattern of the metal bumps between the stacked semiconductor chips. Further, if a plurality of semiconductor chips are stacked on a substrate, the option circuits can be suitably selected in accordance with the connecting pattern of the metal bumps between the stacked semiconductor chips and the connecting pattern of the metal bumps between the substrate and the lowermost semiconductor chip.

The first object of the present invention is also achieved by a multichip semiconductor device comprising a plurality of semiconductor chips of substantially same structure stacked in layers, each semiconductor chip including: a semiconductor substrate and elements integrated therein; a connecting plug inserted in a through hole made through the semiconductor substrate; and a bump for selectively connecting the connecting plug in the semiconductor substrate, wherein allocation of addresses of the semiconductor chips is designated by a connecting pattern of the bumps.

With the above constitution, since a plurality of semiconductor chips of the same structure are stacked, it is unnecessary to produce a plurality of kinds of semiconductor chips of different structures, and all semiconductor chips can be subjected to the same test. Further, it is unnecessary to consider the order of semiconductor chips to be stacked. Therefore, the production cost can be reduced. In addition, the allocation of the addresses of the semiconductor chips can be designated in accordance with the connecting pattern of the metal bumps between the stacked semiconductor memory chips.

The second object is achieved by a memory card comprising: a plurality of semiconductor memory chips of substantially same structure stacked in layers, each semiconductor memory chip including a semiconductor substrate and elements integrated therein, a connecting plug inserted in a through hole made through the semiconductor substrate, and a bump for selectively connecting the connecting plug in the semiconductor substrate; a card-like package sealing the plurality of semiconductor memory chips stacked in layers; and terminals, provided on a surface of the card-like package, for transmitting/receiving a signal to/from the semiconductor memory chips through the connecting plugs and the bumps, wherein allocation of addresses of the semiconductor memory chips is designated by a connecting pattern of the bumps.

With the above constitution, since a plurality of semiconductor memory chips of the same structure are stacked in a card package, it is unnecessary to produce a plurality of kinds of semiconductor memory chips of different structures, and all semiconductor memory chips can be subjected to the same test. Further, it is unnecessary to consider the order of semiconductor memory chips to be stacked. Therefore, the production cost can be reduced. In addition, the allocation of the addresses of the semiconductor memory chips can be designated in accordance with the connecting pattern of the metal bumps between the stacked semiconductor memory chips. Since a plurality of semiconductor memory chips are stacked one on another, the area of the plane surface the card can be small. Moreover, since the semiconductor memory chips are stacked with metal bumps interposed therebetween, a thin memory card can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
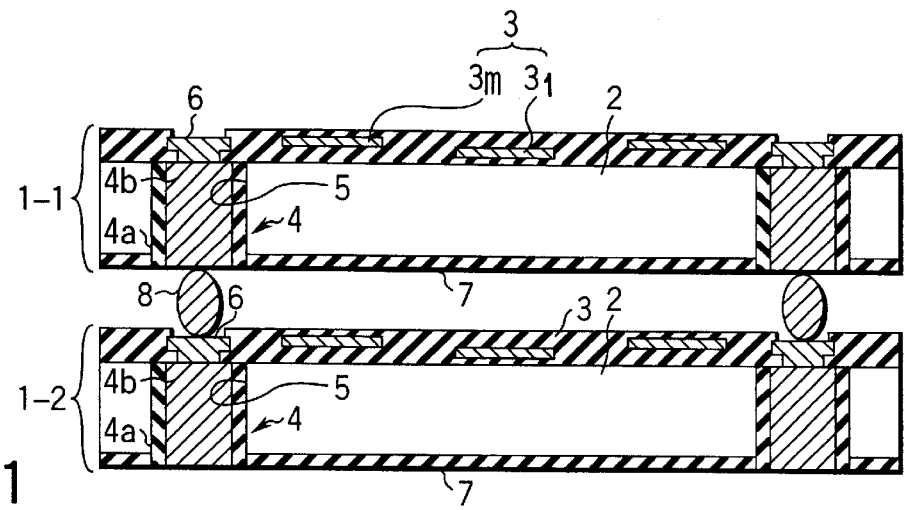
FIG. 1 is a cross-sectional view, for explaining a technique, showing a multichip semiconductor device disclosed in the prior Japanese patent application filed by the applicant on which the present invention is based.

First, the multichip semiconductor device disclosed in Japanese Patent Application No. 8-321931 filed by the present applicant will be described as a base of the present invention. FIG. 1 is a cross-sectional view showing the multichip semiconductor device. The semiconductor device comprises two semiconductor chips 1—1 and 1-2 stacked one on the other (although the above Japanese application describes various embodiments, only the gist of the invention will be briefly described below to make the explanation simple). Each of the chips 1—1 and 1-2 mainly comprises a silicon substrate 2 on which elements are integrated, a multiple wiring layer 3 for connecting the elements in a predetermined relationship, and a connecting plug 4 passed through the silicon substrate 2 to electrically connect the chips 1—1 and 1-2. The plug 4 is formed outside of the element region of the silicon substrate 2. It comprises an insulating film 4a formed on the side wall of a through hole in the silicon substrate 2, and a conductive feedthrough plug 4b embedded in the through hole 5 and electrically insulated from the silicon substrate 2 by the insulating film 4a. The multiple wiring layer 3 includes at least two wiring layers $3_1$, $3_2, \ldots, 3_m (m \geq 2)$. After the connecting plug 4 is formed, a pad 6 is formed on the connecting plug 4 and connected to the elements in the silicon substrate 2 by, for example, the uppermost wiring layer $3_m$. An insulating film 7 covers all region of the rear surface of the silicon substrate 2 except for the connecting plug 4, opposite to the surface on which the pad 6 is formed. The feedthrough plug 4b of the chip 1—1 is electrically connected to the pad 6 connected to the multiple wiring layer 3 of the chip 1-2 via a solder bump (metal bump) 8. Thus, the chips 1—1 and 1-2 are electrically connected.

The present invention is an improvement of the invention of the prior application described above. According to the present invention, a plurality of semiconductor chips of the same structure are stacked one on another, and option circuits of each semiconductor chip are selected in accordance with the connecting pattern of the metal bumps provided between the semiconductor chips. Further, a plurality of semiconductor memory chips of the same structure are stacked one on another, and the allocation of the addresses between semiconductor memory chips is designated in accordance with the connecting pattern of the metal bumps between the semiconductor memory chips. Furthermore, the stacked semiconductor memory chips are sealed in a card-like package, thereby forming a memory card.

Embodiments of the present invention will now be described with reference to the drawings.

Figure 2:
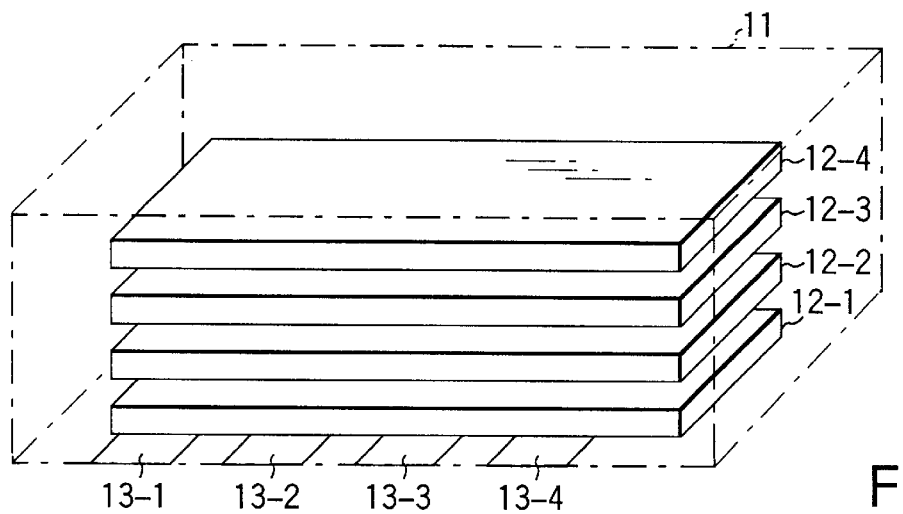
FIG. 2 is a schematic perspective view showing an internal structure of a multichip semiconductor device according to a first embodiment of the present invention, seen through a card package of an SSFDC.

FIG. 2 is a schematic perspective view showing an internal structure of a multichip semiconductor device according to a first embodiment of the present invention, seen through a card-like package of an SSFDC (Solid-State Floppy Disk Card). The SSFDC 11 comprises four semiconductor memory chips, for example, NAND-type EEPROM chips 12-1 to 12-4, which are stacked in layers. All the chips 12-1 to 12-4 have the same structure, basically, the same as the chips 1—1 and 1-2 shown in FIG. 1. A source voltage for the NAND-type EEPROMs, control signals, addresses, input data, etc. are input to the NAND-type EEPROM chips 12-1 to 12-4 through surface terminals 13-1 to 13-4 (part of which are shown) of the SSFDC 11. Output data are output to an external device from the SSFDC 11 through the surface terminals 13-1 to 13-4.

Figure 3:
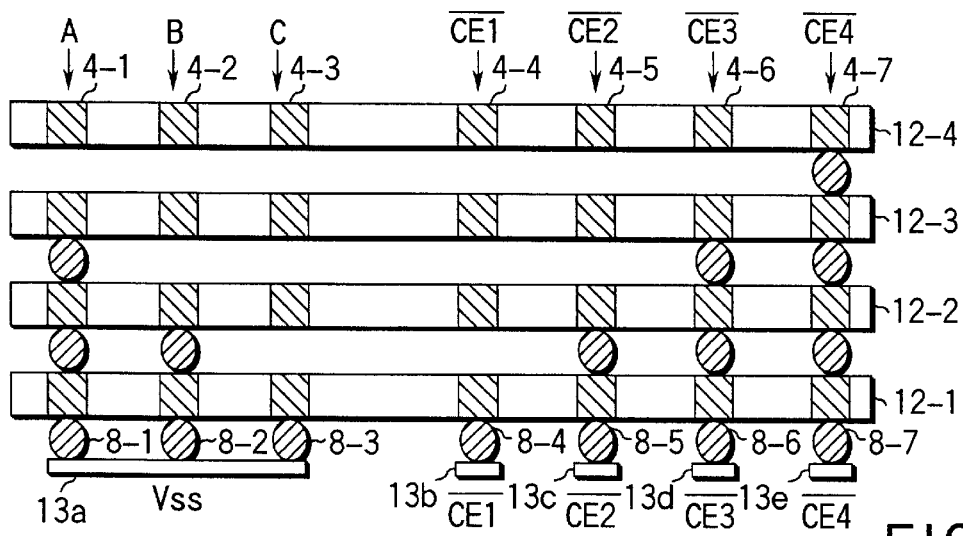
FIG. 3 is a cross-sectional view showing a connecting pattern of solder bumps for selectively connecting semiconductor memory chips in the SSFDC shown in FIG. 2.

FIG. 3 shows a connecting pattern of solder bumps (metal bumps) for selectively connecting semiconductor memory chips in the SSFDC 11 shown in FIG. 2. A ground voltage Vss, a first chip selection signal $\overline{CE1}$, a second chip selection signal $\overline{CE2}$, a third chip selection signal $\overline{CE3}$ and a fourth chip selection signal $\overline{CE4}$ are respectively supplied to terminals 13a to 13e connected to the surface terminals 13-1 to 13-4 (part of which are shown). Connecting plugs 4-1 to 4-3 of the semiconductor memory chip 12-1 are connected in common to the terminal 13a through solder bumps 8-1 to 8-3, respectively, and connecting plugs 4-4 to 4-7 are respectively connected to the terminals 13b to 13e through solder bumps 8-4 to 8-7. Connecting plugs 4-1 and 4-2 of the semiconductor memory chip 12-2 are connected in common to the terminal 13a by the solder bumps 8-1 and 8-2 through the connecting plugs and the solder bumps of the semiconductor memory chip 12-1, and connecting plugs 4-5 to 4-7 are respectively connected to the terminals 13c to 13e by the solder bumps 8-5 to 8-7 through the connecting plugs and the solder bumps of the semiconductor memory chip 12-1. A connecting plug 4-1 of the semiconductor memory chip 12-3 is connected to the terminal 13a by the solder bump 8-1 through the connecting plugs and the solder bumps of the semiconductor memory chips 12-2 and 12-1, and connecting plugs 4-6 and 4-7 are respectively connected to the terminals 13d and 13e by the solder bumps 8-6 and 8-7 through the connecting plugs and the solder bumps of the semiconductor memory chips 12-2 and 12-1. Further, a connecting plug 4-7 of the semiconductor memory chip 12-4 is connected to the terminal 13e by the solder bump 8-7 through the connecting plugs and the solder bumps of the semiconductor memory chips 12-3, 12-2 and 12-1.

As a result, the semiconductor chip 12-1 receives the ground voltage Vss as the signals A, B and C, and the chip selection signals $\overline{CE1}$, $\overline{CE2}$, $\overline{CE3}$ and $\overline{CE4}$. The semiconductor chip 12-2 receives the ground voltage V as the signals A and B, and the chip selection signals $\overline{CE2}$, $\overline{CE3}$ and $\overline{CE4}$. The semiconductor chip 12-3 receives the ground voltage V as the signal A, and the chip selection signals $\overline{CE3}$ and $\overline{CE4}$. The semiconductor chip 12-4 does not receive the signal A, B or C, but receives the chip selection signal CE4.

Figure 4:
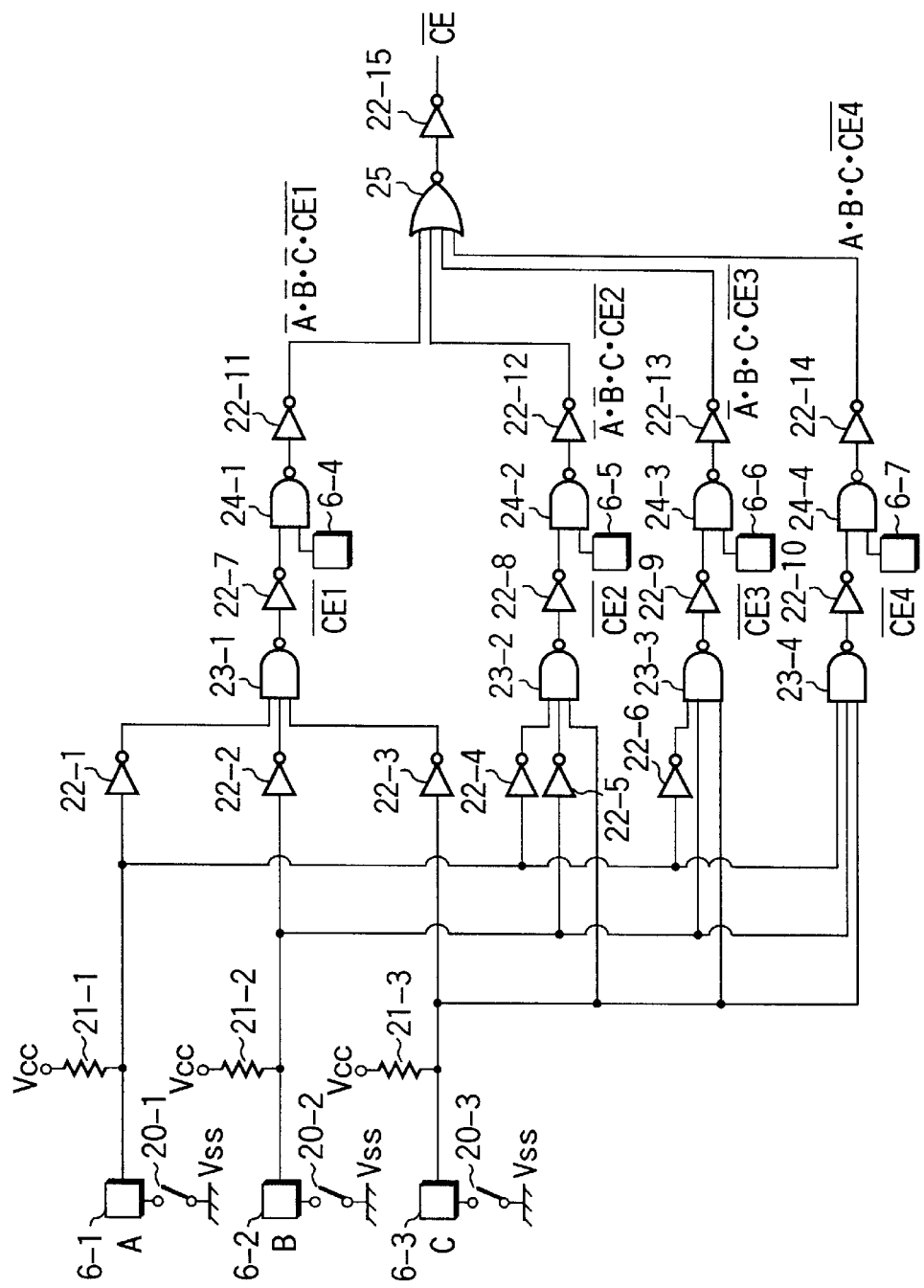
FIG. 4 is a circuit diagram showing a concrete circuit structure of a part of each semiconductor memory chip shown in FIG. 3.

FIG. 4 shows a concrete circuit structure of a part of each of the semiconductor memory chips 12-1 to 12-4 shown in FIG. 3. This circuit detects what of the memory chips 12-1 to 12-4 is selected by the signals A to C and $\overline{CE1}$ to $\overline{CE4}$, and activates the selected chip. This circuit comprises resistors 21-1 to 21-3, inverter circuits 22-1 to 22-15, three-input NAND circuits 23-1 to 23-4, two-input NAND circuits 24-1 to 24-4, a four-input NOR circuit 25. The solder bumps 8-1 to 8-3 are represented as switches 20-1 to 20-3 in FIG. 4.

As equivalently represented by the switches 20-1 to 20-3, the solder bumps are selectively provided between the ground Vss and pads 6-1 to 6-3 to which the signals A to C are supplied (pads located on the connecting plugs 4-1 to 4-3 shown in FIG. 3). If a solder bump is provided, the switch is on and the ground voltage Vss is applied. If not, the switch is off, i.e., opened. The resistors 21-1 to 21-3, having a high resistance value, are respectively connected between the pads 6-1 to 6-3 and the power source Vcc. The pads 6-1 to 6-3 are respectively connected to input terminals of the inverter circuits 22-1 to 22-3. Output terminals of the inverter circuits 22-1 to 22-3 are connected to input terminals of the NAND circuit 23-1. The pads 6-1 and 6-2 are respectively connected to input terminals of the inverter circuits 22-4 and 22-5. Output terminals of the inverter circuits 22-4 and 22-5 and the pad 6-3 are connected to input terminals of the NAND circuit 23-2. The pad 6-1 is connected to an input terminal of the inverter circuit 22-6. An output terminal of the inverter circuit 22-6 and the pads 6-2 and 6-3 are connected to input terminals of the NAND circuit 23-3. Further, the pads 6-1 to 6-3 are connected to input terminals of the NAND circuit 23-4.

An output terminal of the NAND circuit 23-1 is connected to an input terminal of the inverter circuit 22-7. An output terminal of the inverter circuit 22-7 is connected to one of the input terminals of the NAND circuit 24-1. The other input terminal of the NAND circuit 24-1 is connected to a pad 6-4 to which the chip selection signal $\overline{CE1}$ is input. An output terminal of the NAND circuit 23-2 is connected to an input terminal of the inverter circuit 22-8. An output terminal of the inverter circuit 22-8 is connected to one of the input terminals of the NAND circuit 24-2. The other input terminal of the NAND circuit 24-2 is connected to a pad 6-5 to which the chip selection signal $\overline{CE2}$ is input. In the same manner, an output terminal of the NAND circuit 23-3 is connected to an input terminal of the inverter circuit 22-9. An output terminal of the inverter circuit 22-9 is connected to one of the input terminals of the NAND circuit 24-3. The other input terminal of the NAND circuit 24-3 is connected to a pad 6—6 to which the chip selection signal $\overline{CE3}$ is input.

Further, an output terminal of the NAND circuit 23-4 is connected to an input terminal of the inverter circuit 22-10. An output terminal of the inverter circuit 22-10 is connected to one of the input terminals of the NAND circuit 24-4. The other input terminal of the NAND circuit 24-4 is connected to a pad 6-7 to which the chip selection signal $\overline{CE4}$ is input.

Output terminals of the NAND circuits 24-1 to 24-4 are connected to input terminals of the inverter circuits 22-11 to 22-14. Output terminals of the inverter circuits 22-11 to 22-14 are connected to input terminals of the NOR circuit 25. An output terminal of the NOR circuit 25 is connected to an input terminal of the inverter circuit 22-15. A chip selection signal $\overline{CE}$ is obtained from an output terminal of the inverter circuit 22-15.

A logical output from the inverter circuit 22-11 is $\overline{A} \cdot \overline{B} \cdot \overline{C} \cdot \overline{CE1}$. A logical output from the inverter circuit 22-12 is $\overline{A} \cdot \overline{B} \cdot C \cdot \overline{CE2}$. A logical output from the inverter circuit 22-13 is $\overline{A} \cdot B \cdot C \cdot \overline{CE3}$. A logical output from the inverter circuit 22-14 is $A \cdot B \cdot C \cdot \overline{CE4}$.

Figure 5:
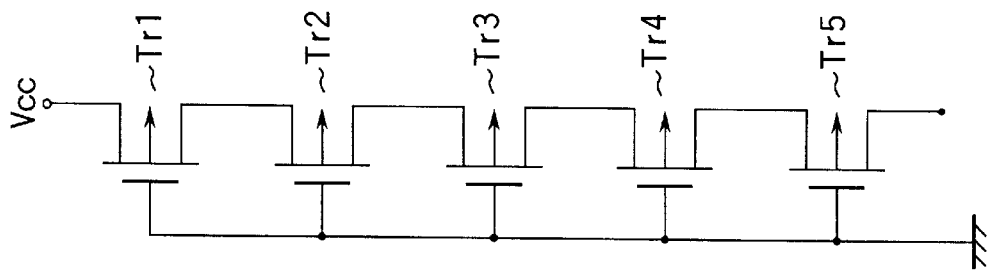
FIG. 5 is a circuit diagram showing a resistor having a high resistance value of the circuit shown in FIG. 4.

It is preferable that MOS transistors having a short channel width W and a long channel length L be used as the resistors 21-1 to 21-3. Alternatively, the resistors may be constituted by a plurality of MOS transistors connected in series as shown in FIG. 5. The reason is that, with this constitution, a through current regularly flowing from the power source Vcc to the ground Vss can be reduced, when the resistors are grounded via the solder bumps 8-1 to 8-3. FIG. 5 shows an example wherein P-channel MOS transistors Tr1 to Tr5 are used as the resistors 21-1 to 21-3. The current paths of the MOS transistors Tr1 to Tr5 are connected in series and the gates thereof are grounded.

According to the circuit shown in FIG. 4, the chip 12-1 shown in FIG. 3 (in which the switches 20-1 to 20-3 are on and the signals A to C are at the ground voltage Vss) is controlled and activated by the first chip selection signal $\overline{CE1}$. The chip 12-2 shown in FIG. 3 (in which the switches 20-1 and 20-2 are on and the signals A and B are at the ground voltage Vss, while the switch 20-3 is off and the signal C is at the source voltage Vcc) is controlled and activated by the second chip selection signal $\overline{CE2}$. The chip 12-3 shown in FIG. 3 (in which the switch 20-1 is on and the signal A is at the ground voltage Vss, while the switches 20-2 and 20-3 are off and the signals B and C are at the source voltage Vcc) is controlled and activated by the third chip selection signal $\overline{CE3}$. Further, the chip 12-4 shown in FIG. 3 (in which the switches 20-1 to 20-3 are off and the signals A to C are the source voltage Vcc) is controlled and activated by the fourth chip selection signal $\overline{CE4}$. The above description is summarized in Table 1 indicated below.

TABLE 1

| A | B | C | $\overline{CE}$ | Chip |
|---|---|---|---|---|
| Vss(0) | Vss(0) | Vss(0) | $\overline{CE1}$ | Chip 12-1 |
| Vss(0) | Vss(0) | Vcc(1) | $\overline{CE2}$ | Chip 12-2 |
| Vss(0) | Vcc(1) | Vcc(1) | $\overline{CE3}$ | Chip 12-3 |
| Vcc(1) | Vcc(1) | Vcc(1) | $\overline{CE4}$ | Chip 12-4 |

In Table 1, "Vss (0)" represents a condition that any one of the solder bumps 8-1 to 8-3 is provided (a condition that any one of the switches 20-1 to 20-3 is on), and the corresponding one of the pads 6-1 to 6-3 is grounded. "Vcc (1)" represents a condition that none of the solder bumps 8-1 to 8-3 are provided (a condition that all the switches 20-1 to 20-3 are off), and any one of the pads 6-1 to 6-3 is biased by the source voltage Vcc through the resistor 21-1, 21-2 or 21-3 of a high resistance value. If no solder bump is provided on the pads 6-1 to 6-3, these pads are biased by the source voltage Vcc through the resistors 21-1 to 21-3. Therefore, the levels of the signals A, B and C can be set depending on whether solder bumps are provided. Thus, the semiconductor memory chips 12-1 to 12-4 can be selected freely in accordance with the connecting pattern of solder bumps.

Assuming that the number of semiconductor memory chips mounted in layers is n, the semiconductor memory chips can be allocated by means of at least an (n−1)-number of connecting plugs.

With the above constitution, since a plurality of semiconductor memory chips of the same structure are stacked in a card package, it is unnecessary to produce a plurality of kinds of semiconductor memory chips of different structures, and all semiconductor memory chips can be subjected to the same test. Further, it is unnecessary to consider the order of semiconductor memory chips to be stacked. Therefore, the production cost can be reduced. In addition, the allocation of the addresses of the semiconductor memory chips can be designated in accordance with the connecting pattern of the metal bumps between the stacked semiconductor memory chips. Since a plurality of semiconductor memory chips are stacked one on another, the area of the plane surface of the card can be small. Moreover, since the semiconductor memory chips are stacked with metal bumps interposed therebetween, a thin memory card can be obtained.

Figure 6:
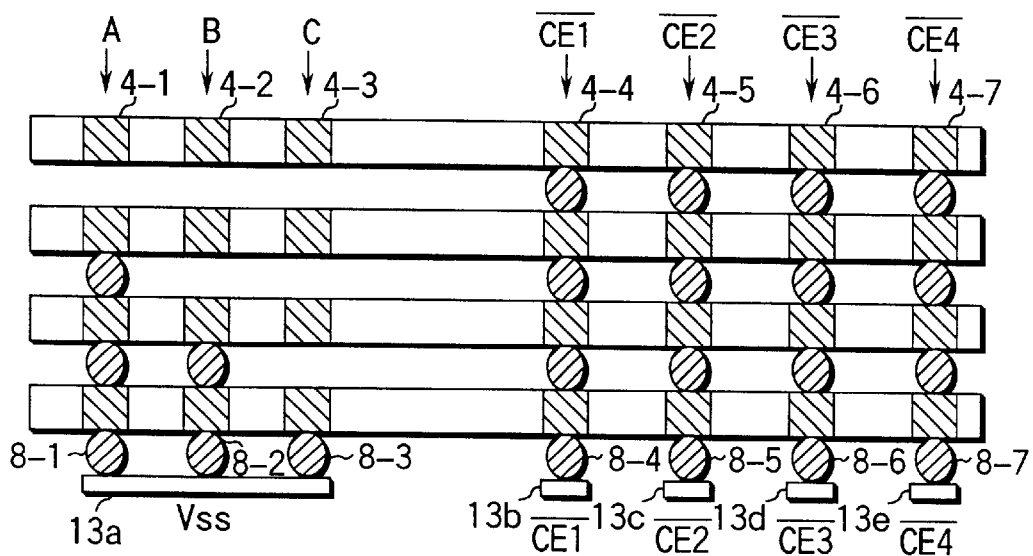
FIG. 6 is a cross-sectional view showing another connecting pattern of solder bumps for explaining a multichip semiconductor device according to a second embodiment of the present invention.

FIG. 6 shows another connecting pattern of solder bumps for explaining a multichip semiconductor device according to a second embodiment of the present invention. In FIG. 6, the same elements as those shown in FIG. 3 are identified by the same reference numerals as those used in FIG. 3. According to the second embodiment, solder bumps 8-4 to 8-7 are provided on all semiconductor memory chips 12-1 to 12-4, so that chip selection signals $\overline{CE1}$ to $\overline{CE4}$ can be supplied to all the semiconductor memory chips 12-1 to 12-4.

With this connecting pattern of solder bumps also, selection from the semiconductor memory chips 12-1 to 12-4 can be performed by means of signals A, B and C. Therefore, the same selection as in the first embodiment can be performed without any problem, and the same effect and advantage can be obtained. Thus, it is understood that only three connecting plugs 4-1 to 4-3 are basically required to designate the allocation of the addresses of the four memory chips 12-1 to 12-4 based on the connecting pattern of the solder bumps.

Figure 7:
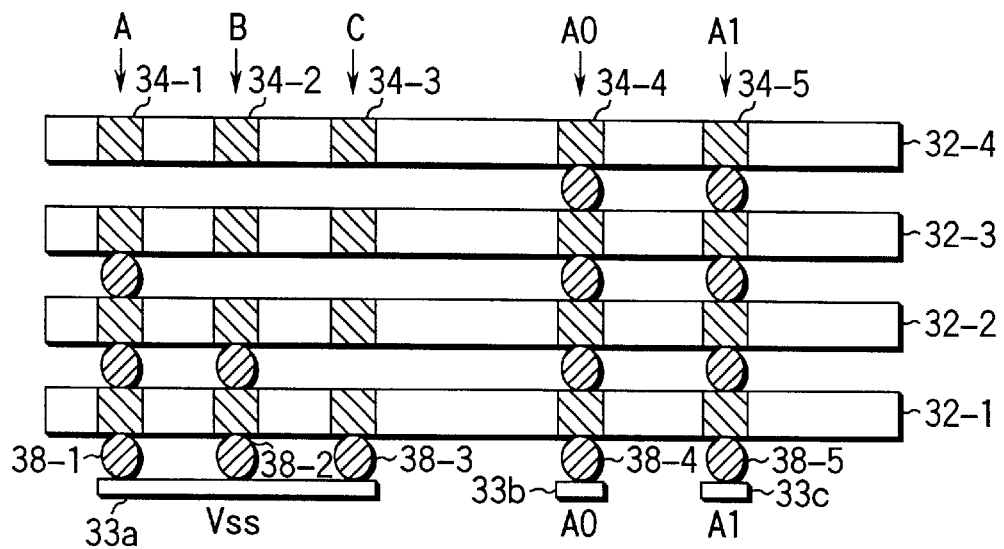
FIG. 7 is a cross-sectional view showing still another connecting pattern of solder bumps for explaining a multichip semiconductor device according to a third embodiment of the present invention.
Figure 8:
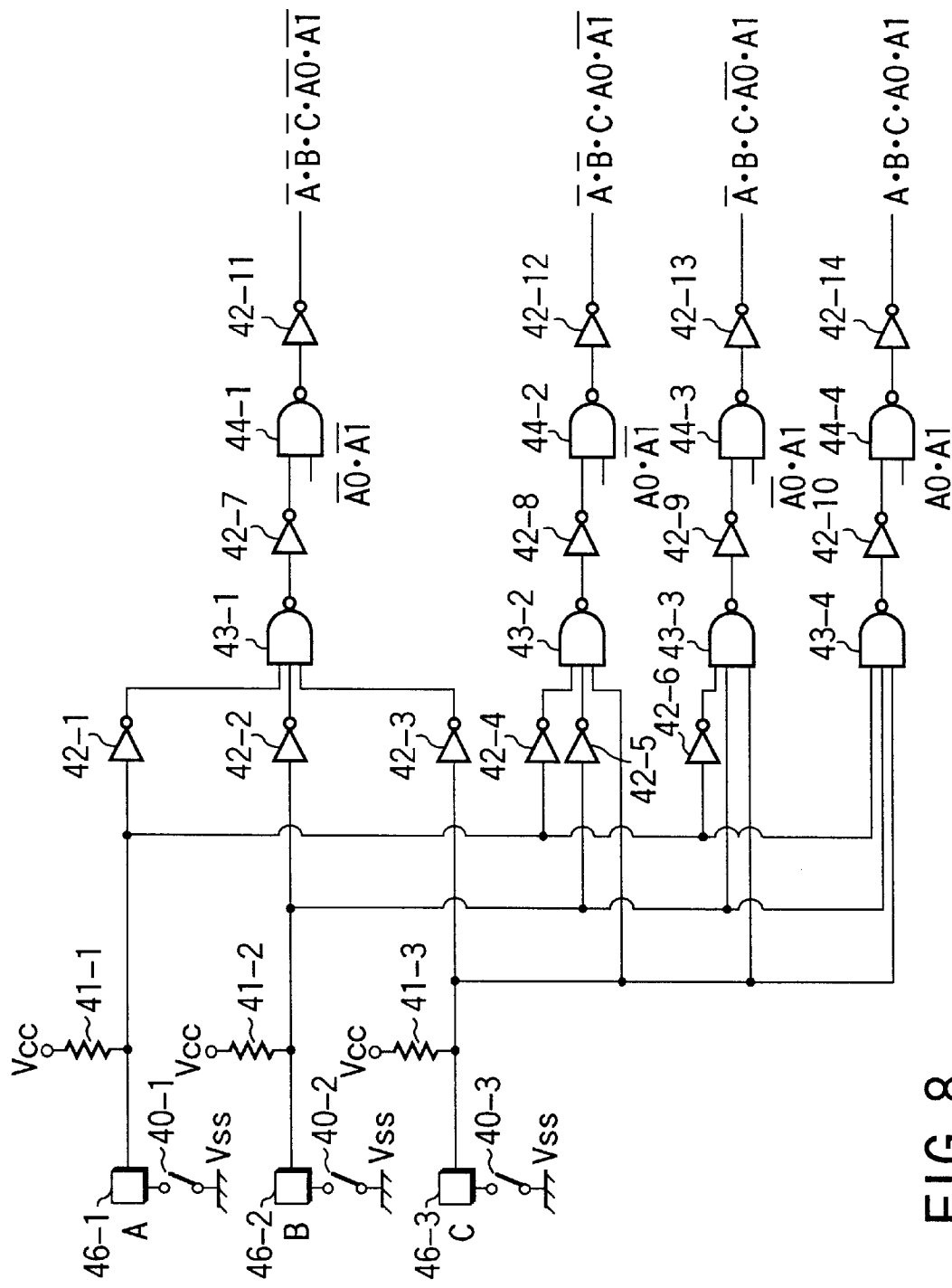
FIG. 8 is a circuit diagram showing a concrete circuit structure of a part of each semiconductor memory chip shown in FIG. 7 for explaining the multichip semiconductor device according to the third embodiment of the present invention.
Figure 9:
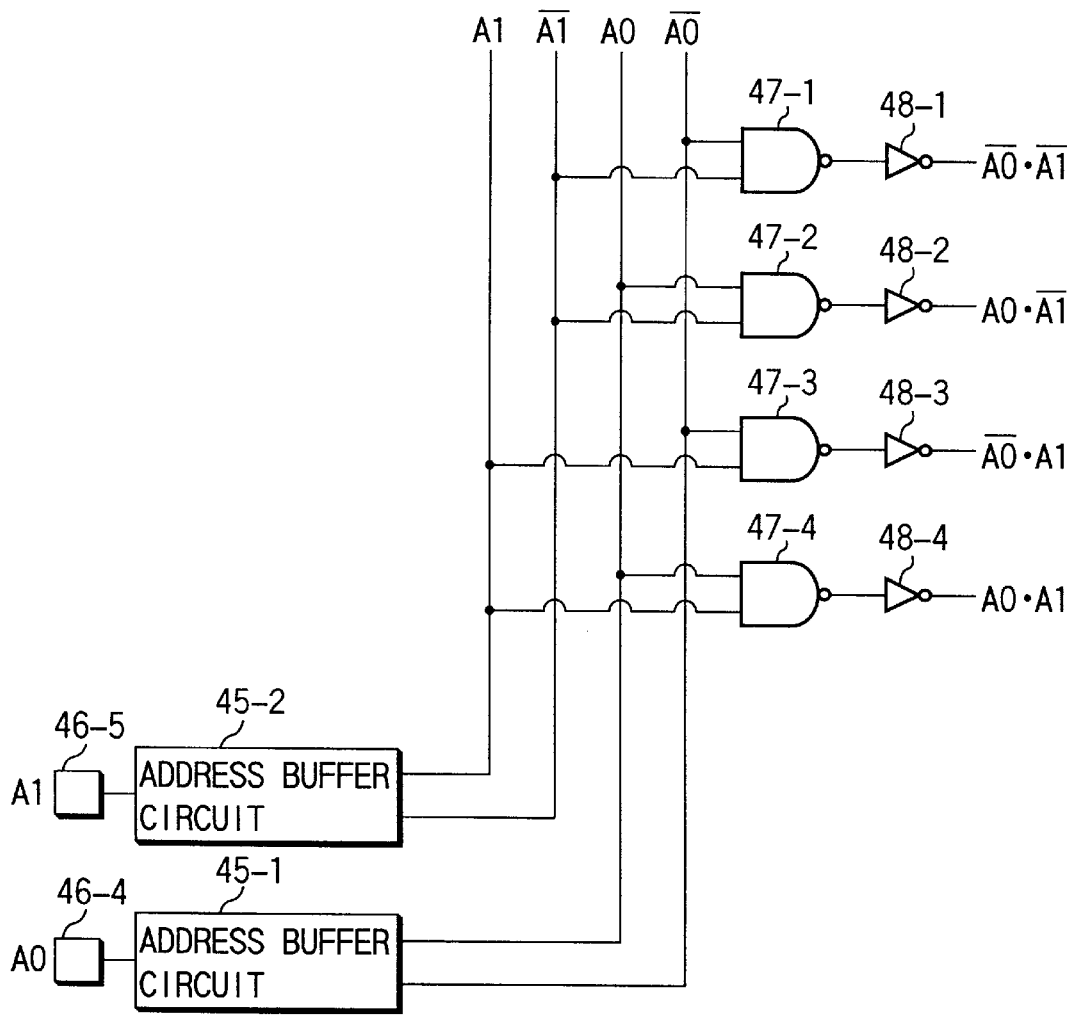
FIG. 9 is a circuit diagram showing a concrete circuit structure of a part of each semiconductor memory chip shown in FIG. 7 for explaining the multichip semiconductor device according to the third embodiment of the present invention.

FIGS. 7 to 9 are diagrams for explaining a multichip semiconductor device according to a third embodiment of the present invention. FIG. 7 shows still another connecting pattern of solder bumps. In the connecting pattern of solder bumps 34 of a semiconductor memory device shown in FIG. 7, four semiconductor memory chips 32-1 to 32-4 are stacked in the same manner as in FIG. 3. The ground voltage Vss, an address signal A0 and an address signal A1 are respectively input to terminals 33*a*, 33*b* and 33*c* (part of which are shown) connected to surface terminals of an SSFDC. Connecting plugs 34-1 to 34-3 of the semiconductor memory chip 32-1 are connected in common to the terminal 33*a* by solder bumps 38-1 to 38-3 respectively, and connecting plugs 34-4 and 34-5 are respectively connected to the terminals 33*b* and 33*c* by solder bumps 38-4 and 38-5. Connecting plugs 34-1 and 34-2 of the semiconductor memory chip 32-2 are connected in common to the terminal 33*a* respectively by the solder bumps 38-1 and 38-2 through the connecting plugs and the solder bumps of the semiconductor memory chip 32-1, and connecting plugs 34-4 and 34-5 are respectively connected to the terminals 33b and 33c by the solder bumps 38-4 and 38-5 through the connecting plugs and the solder bumps of the semiconductor memory chip 32-1. A connecting plug 34-1 of the semiconductor memory chip 32-3 is connected to the terminal 33a by the solder bump 38-1 through the connecting plugs and the solder bumps of the semiconductor memory chips 32-2 and 32-1, and connecting plugs 34-4 and 34-5 are respectively connected to the terminals 33b and 33c by the solder bumps 38-4 and 38-5 through the connecting plugs and the solder bumps of the semiconductor memory chips 32-2 and 32-1. Connecting plugs 34-4 and 34-5 of the semiconductor memory chip 32-4 are respectively connected to the terminals 33b and 33c by solder bumps 38-4 and 38-5 through the connecting plugs and the solder bumps of the semiconductor memory chips 32-3, 32-2 and 32-1.

As a result, the semiconductor chip 32-1 receives the ground voltage Vss as the signals A, B and C, the semiconductor chip 32-2 receives the ground voltage Vss as the signals A and B, and the semiconductor chip 32-3 receives the ground voltage Vss as the signal A. The semiconductor chip 32-4 does not receive the signal A, B or C. The address signals A0 and A1 are input in common to the semiconductor memory chips 32-1 to 32-4.

FIGS. 8 and 9 show concrete circuit structures of parts of each semiconductor memory chip shown in FIG. 7. The circuit shown in FIG. 8 comprises resistors 41-1 to 41-3, inverter circuits 42-1 to 42-14, three-input NAND circuits 43-1 to 43-4 and two-input NAND circuits 44-1 to 44-4. Solder bumps are represented by switches 40-1 to 40-3. The circuit shown in FIG. 9 comprises address buffer circuits 45-1 and 45-2, two-input NAND circuits 47-1 to 47-4 and inverter circuits 48-1 to 48-4.

As shown in FIG. 8, solder bumps are selectively provided between the ground Vss and pads 46-1 to 46-3 to which the signals A to C are supplied, as equivalently represented by the switches 40-1 to 40-3. If a solder bump is provided, the switch is on. If not, the switch is off. The resistors 41-1 to 41-3, having a high resistance value, are respectively connected between the pads 46-1 to 46-3 and the power source Vcc. The pads 46-1 to 46-3 are respectively connected to input terminals of the inverter circuits 42-1 to 42-3. Output terminals of the inverter circuits 42-1 to 42-3 are connected to input terminals of the NAND circuit 43-1. The pads 46-1 and 46-2 are also connected to input terminals of the inverter circuits 42-4 and 42-5 respectively. Output terminals of the inverter circuits 42-4 and 42-5 and the pad 46-3 are connected to input terminals of the NAND circuit 43-2. The pad 46-1 is connected to an input terminal of the inverter circuit 42-6. An output terminal of the inverter circuit 42-6 and the pads 46-2 and 46-3 are connected to input terminals of the NAND circuit 43-3. Further, the pads 46-1 to 46-3 are connected to input terminals of the NAND circuit 43-4.

An output terminal of the NAND circuit 43-1 is connected to an input terminal of the inverter circuit 42-7. An output terminal of the inverter circuit 42-7 is connected to one of the input terminals of the NAND circuit 44-1. An address signal $\overline{A0} \cdot \overline{A1}$ is supplied to the other input terminal of the NAND circuit 44-1. An output terminal of the NAND circuit 43-2 is connected to an input terminal of the inverter circuit 42-8. An output terminal of the inverter circuit 42-8 is connected to one of the input terminals of the NAND circuit 44-2. An address signal $A0 \cdot \overline{A1}$ is supplied to the other input terminal of the NAND circuit 44-2. In the same manner, an output terminal of the NAND circuit 43-3 is connected to an input terminal of the inverter circuit 42-9. An output terminal of the inverter circuit 42-9 is connected to one of the input terminals of the NAND circuit 44-3. An address signal $\overline{A0} \cdot A1$ is supplied to the other input terminal of the NAND circuit 44-3. Further, an output terminal of the NAND circuit 43-4 is connected to an input terminal of the inverter circuit 42-10. An output terminal of the inverter circuit 42-10 is connected to one of the input terminals of the NAND circuit 44-4. An address signal $A0 \cdot A1$ is supplied to the other input terminal of the NAND circuit 44-4.

An output terminal of the NAND circuit 44-1 is connected to an input terminal of the inverter circuit 42-11. A logical signal $\overline{A} \cdot \overline{B} \cdot \overline{C} \cdot \overline{A0} \cdot \overline{A1}$ is output from an output terminal of the inverter circuit 42-11. An output terminal of the NAND circuit 44-2 is connected to an input terminal of the inverter circuit 42-12. A logical signal $\overline{A} \cdot \overline{B} \cdot C \cdot A0 \cdot \overline{A1}$ is output from an output terminal of the inverter circuit 42-12. An output terminal of the NAND circuit 44-3 is connected to an input terminal of the inverter circuit 42-13. A logical signal $\overline{A} \cdot B \cdot C \overline{A0} \cdot A1$ is output from an output terminal of the inverter circuit 42-13. An output terminal of the NAND circuit 44-4 is connected to an input terminal of the inverter circuit 42-14. A logical signal $A \cdot B \cdot C \cdot A0 \cdot A1$ is output from an output terminal of the inverter circuit 42-14.

In other words, the signal $\overline{A} \cdot \overline{B} \cdot \overline{C} \cdot \overline{A0} \cdot \overline{A1}$ 1 is output from the inverter circuit 42-11, the signal $\overline{A} \cdot \overline{B} \cdot C \cdot A0 \cdot \overline{A1}$ is output from the inverter circuit 42-12, the signal $\overline{A} \cdot B \cdot C \cdot \overline{A0} \cdot A1$ is output from the inverter circuit 42-13, and the signal $A \cdot B \cdot C \cdot A0 \cdot A1$ is output from the inverter circuit 42-14.

FIG. 9 shows a signal generating circuit for supplying signals $\overline{A0} \cdot \overline{A1}$, $A0 \cdot \overline{A1}$, $\overline{A0} \cdot A1$ and $A0 \cdot A1$ to the NAND circuits 44-1 to 44-4 shown in FIG. 8. Pads 46-4 and 46-5, to which the address signals A0 and A1 are input, are respectively connected to input terminals of the address buffer circuits 45-1 and 45-2. Signals $\overline{A0}$, A0, $\overline{A1}$ and A1 output from the address buffer circuits 45-1 and 45-2 are selectively supplied to NAND circuits 47-1 to 47-4. More specifically, an $\overline{A0}$ output terminal of the address buffer circuit 45-1 is connected to one of the input terminals of the NAND circuit 47-1, and an $\overline{A1}$ output terminal of the address buffer circuit 45-2 is connected to the other input terminal thereof. An A0 output terminal of the address buffer circuit 45-1 is connected to one of the input terminals of the NAND circuit 47-2, and the $\overline{A1}$ output terminal of the address buffer circuit 45-2 is connected to the other input terminal thereof. The $\overline{A0}$ output terminal of the address buffer circuit 45-1 is connected to one of the input terminals of the NAND circuit 47-3, and an A1 output terminal of the address buffer circuit 45-2 is connected to the other input terminal thereof. The A0 output terminal of the address buffer circuit 45-1 is connected to one of the input terminals of the NAND circuit 47-4, and the A1 output terminal of the address buffer circuit 45-2 is connected to the other input terminal thereof. Output terminals of the NAND circuits 47-1 to 47-4 are respectively connected to input terminals of the inverter circuits 48-1 to 48-4. A logical signal $\overline{A0} \cdot \overline{A1}$ is output from an output terminal of the inverter circuit 48-1 and supplied to the other input terminal of the NAND circuit 44-1. A logical signal $A0 \cdot \overline{A1}$ is output from an output terminal of the inverter circuit 48-2 and supplied to the other input terminal of the NAND circuit 44-2. A logical signal $\overline{A0} \cdot A1$ is output from an output terminal of the inverter circuit 48-3 and supplied to the other input terminal of the NAND circuit 44-3. A logical signal $A0 \cdot A1$ is output from an output terminal of the inverter circuit 48-4 and supplied to the other input terminal of the NAND circuit 44-4.

According to the circuits shown in FIGS. 8 and 9, the chip 32-1 shown in FIG. 7 (in which the signals A to C are at the ground voltage Vss) is selected by the address signal (A0=0, A1=0). The chip 32-2 (in which the signals A and B are at the ground voltage Vss and the signal C is at the source voltage Vcc) is selected by the address signal (A0=1, A1=0). The chip 32-3 (in which the signal A is at the ground voltage Vss and the signals B and C are at the source voltage Vcc) is selected by the address signal (A0=0, A1=1). The chip 32-4 (in which the signals A to C are at the source voltage Vcc) is selected by the address signal (A0=1, A1=1). The above description is summarized in Table 2 indicated below.

TABLE 1

| A | B | C | (A0, A1) | Chip |
|---|---|---|---|---|
| Vss(0) | Vss(0) | Vss(0) | (0, 0) | Chip 32-1 |
| Vss(0) | Vss(0) | Vcc(1) | (0, 1) | Chip 32-2 |
| Vss(0) | Vcc(1) | Vcc(1) | (1, 0) | Chip 32-3 |
| Vcc(1) | Vcc(1) | Vcc(1) | (1, 1) | Chip 32-4 |

In Table 2, "Vss (0)" represents a condition that any one of the solder bumps 38-1 to 38-3 is provided (a condition that any one of the switches 40-1 to 40-3 is on), and the corresponding one of the pads 46-1 to 46-3 is grounded. "Vcc (1)" represents a condition that none of the solder bumps 38-1 to 38-3 are provided (a condition that all the switches 40-1 to 40-3 are off), and any one of the pads 36-1 to 36-3 is biased by the source voltage Vcc through the resistor 41-1 to 41-2 or 41-3 of a high resistance value. If no solder bump is provided on the pads 46-1 to 46-3, these pads are biased by the source voltage Vcc through the resistors 41-1 to 41-3 in the same manner as in the circuit shown in FIG. 4. Therefore, the levels of the signals A, B and C can be set depending on whether solder bumps are provided. Thus, the semiconductor memory chips 32-1 to 32-4 can be selected freely in accordance with the signals A to C and the address signals A0 and A1.

Assuming that the number of stacked semiconductor memory chips is n, the semiconductor memory chips can be allocated by means of at least an (n–1)-number of connecting plugs, and one of the n-number of semiconductor memory chips can be selected by inputting a [log(n)/log 2]-number of addresses.

Figure 10:
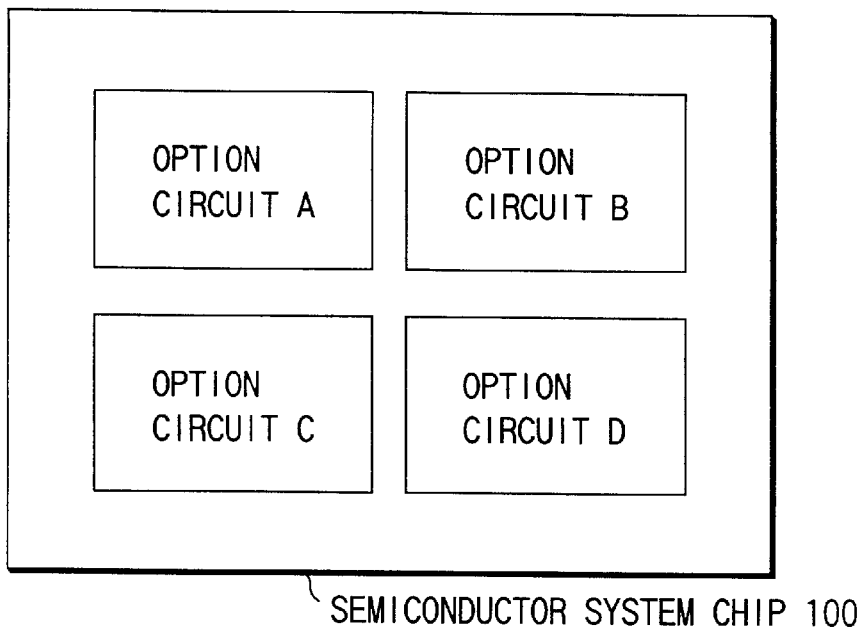
FIG. 10 is a block diagram for explaining a multichip semiconductor device according to a fourth embodiment of the present invention, in which a semiconductor system chip is used in place of each semiconductor memory chip in the structure shown in FIGS. 2 and 3.
Figure 11:
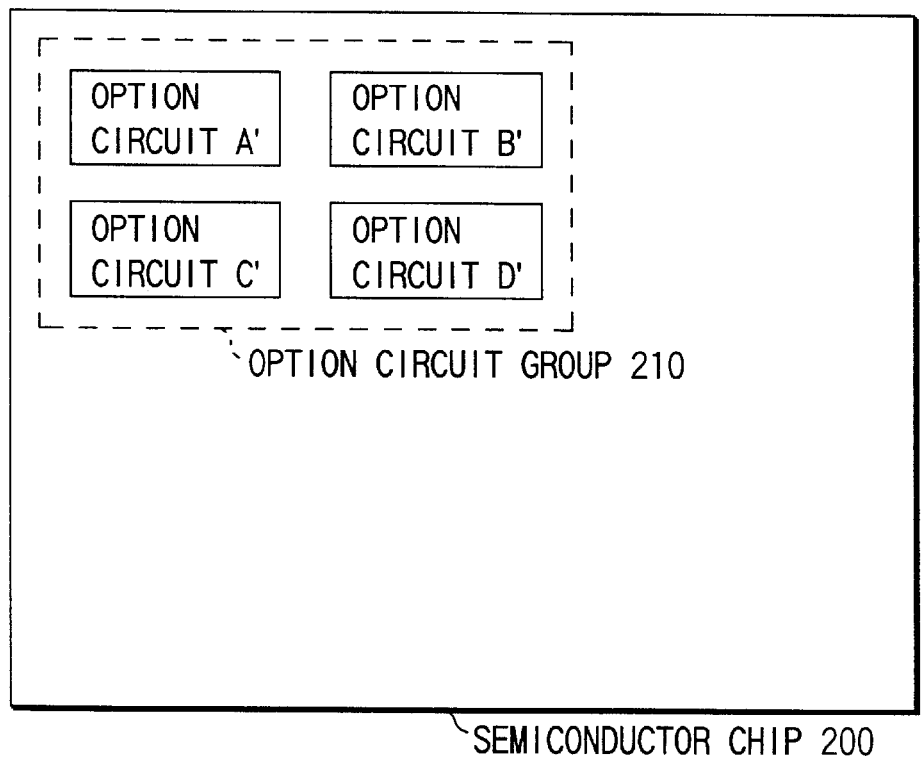
FIG. 11 is a block diagram for explaining a multichip semiconductor device according to a fifth embodiment of the present invention, in which a semiconductor chip having an option circuit group is used in place of each semiconductor memory chip in the structure shown in FIGS. 2 and 3.

A semiconductor system chip 100 shown in FIG. 10 may be used in place of each of the semiconductor memory chips 12-1 to 12-4 shown in FIGS. 2 and 3. Option circuits A to D of the chip 100 as shown in FIG. 10 can be selected in accordance with the connecting pattern of solder bumps in the same manner described above with reference to FIG. 3. Further, the present invention can be applied to the case as shown in FIG. 11 in which an option circuit group 210 is provided in a portion of a semiconductor chip 200. Option circuits A' to D' of the option circuit group 210 can be selected in accordance with the connecting pattern of solder bumps. Each of the option circuits A' to D' may be a bit structure setting circuit for determining the number of bits of input/output data, or a switching circuit for switching allocation (TOP/BOTTOM) of addresses to designate an anomalous block of the semiconductor chip. In this case, the same option circuit A', B', C' or D' may be selected from all the stacked semiconductor memory chips in accordance with the connecting pattern of solder bumps. Thus, the present invention can also provide a multichip semiconductor device on which a plurality of chips of the same structure are mounted in layers, each chip having connecting plugs inserted in through holes made through the semiconductor substrate, wherein option circuits of each chip can be selected in accordance with the connecting pattern of metal bumps provided between chips and between the lowermost chip and the substrate on which the multichip semiconductor device is mounted. In particular, a multichip semiconductor device of a large capacity and multiple functions can be provided only by changing the connecting pattern of metal bumps provided between the lowermost chip and the substrate on which the multichip semiconductor device is mounted.

In the embodiment described above, a plurality of semiconductor memory chips are mounted in layers. However, the present invention can be applied to a case where semiconductor chips other than memories or semiconductor chips loaded with both semiconductor memories and logic circuits are mounted in layers.

As has been described above, according to the present invention, a thin multichip semiconductor device which is small in area of the plane surface and simple in structure can be obtained without increasing the manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multichip semiconductor device comprising a plurality of semiconductor chips of substantially same structure stacked in layers, each semiconductor chip including:
   a semiconductor substrate and elements integrated therein;
   a circuit formed in the semiconductor substrate;
   a connecting plug inserted in a through hole made through the semiconductor substrate; and
   a bump for selectively connecting the connecting plug in the semiconductor substrate,
   wherein the circuits formed in the semiconductor substrate are selected in accordance with a connecting pattern of the bumps.

2. A multichip semiconductor device according to claim 1, wherein allocation of addresses of the semiconductor chips is designated by the connecting pattern of the bumps.

3. A multichip semiconductor device according to claim 1, wherein each of the connecting plugs has an insulating film formed on a side wall of the through hole and a conductive feedthrough plug embedded in the through hole and electrically insulated from the semiconductor substrate by the insulating film.

4. A multichip semiconductor device according to claim 1, wherein each semiconductor chip further includes a multiple wiring layer electrically connecting the connecting plug with the elements integrated in the semiconductor substrate.

5. A multichip semiconductor device according to claim 2, wherein if an n-number of semiconductor chips are stacked in layers, at least an (n–1)-number of connecting plugs is provided in each semiconductor chip to allocate the addresses of the semiconductor chips.

6. A multichip semiconductor device according to claim 2, wherein if an n-number of semiconductor chips are stacked in layers, at least an (n–1)-number of connecting plugs is provided in each semiconductor chip to allocate the addresses of the semiconductor chips, and one of the n-number of semiconductor chips is selected by inputting a [log(n)/log 2]-number of addresses.

7. A multichip semiconductor device comprising a plurality of semiconductor chips of substantially same structure stacked in layers, each semiconductor chip including:
- a semiconductor substrate and elements integrated therein;
- a connecting plug inserted in a through hole made through the semiconductor substrate; and
- a bump for selectively connecting the connecting plug in the semiconductor substrate,
- wherein allocation of addresses of the semiconductor chips is designated by a connecting pattern of the bumps.

8. A multichip semiconductor device according to claim 7, wherein each semiconductor chip is a non-volatile semiconductor memory chip.

9. A multichip semiconductor device according to claim 7, wherein each semiconductor chip is a NAND-type EEPROM.

10. A multichip semiconductor device according to claim 7, wherein if an n-number of semiconductor chips are stacked in layers, at least an (n−1)-number of connecting plugs is provided in each semiconductor chip to allocate the addresses of the semiconductor chips.

11. A multichip semiconductor device according to claim 7, wherein if an n-number of semiconductor chips are stacked in layers, at least an (n−1)-number of connecting plugs is provided in each semiconductor chip to allocate the addresses of the semiconductor chips, and one of the n-number of semiconductor chips is selected by inputting a [log(n)/log 2]−number of addresses.

12. A multichip semiconductor device according to claim 7, wherein each of the connecting plugs has an insulating film formed on a side wall of the through hole and a conductive feedthrough plug embedded in the through hole and electrically insulated from the semiconductor substrate by the insulating film.

13. A multichip semiconductor device according to claim 7, wherein each semiconductor chip further includes a multiple wiring layer electrically connecting the connecting plug with the elements integrated in the semiconductor substrate.

14. A memory card comprising:
- a plurality of semiconductor memory chips of substantially same structure stacked in layers, each semiconductor memory chip including:
  - a semiconductor substrate and elements integrated therein;
  - a connecting plug inserted in a through hole made through the semiconductor substrate; and
  - a bump for selectively connecting the connecting plug in the semiconductor-substrate;
- a card-like package sealing the plurality of semiconductor memory chips stacked in layers; and
- terminals, provided on a surface of the card-like package, for transmitting/receiving a signal to/from the semiconductor memory chips through the connecting plugs and the bumps,
- wherein allocation of addresses of the semiconductor memory chips is designated by a connecting pattern of the bumps.

15. A memory card according to claim 14, wherein each of the connecting plugs has an insulating film formed on a side wall of the through hole and a conductive feedthrough plug embedded in the through hole and electrically insulated from the semiconductor substrate by the insulating film.

16. A memory card according to claim 14, wherein each semiconductor memory chip further includes a multiple wiring layer electrically connecting the connecting plug with memory circuit integrated in the semiconductor substrate.

* * * * *